(12) United States Patent
Shoemaker et al.

(10) Patent No.: US 7,506,193 B1
(45) Date of Patent: Mar. 17, 2009

(54) SYSTEMS AND METHODS FOR OVERCOMING PART TO PART SKEW IN A SUBSTRATE-MOUNTED CIRCUIT

(75) Inventors: Jason Shoemaker, Wynnewood, PA (US); James P. Balcerek, Chalfont, PA (US); William E. Oldham, Pottstown, PA (US); Edward T. Cavanagh, Jr., Norristown, PA (US); Michael J. Bradley, Phoenixville, PA (US)

(73) Assignee: Unisys Corporation, Blue Bell, PA (US)

( * ) Notice: Subject to any disclaimer, the term of this patent is extended or adjusted under 35 U.S.C. 154(b) by 410 days.

(21) Appl. No.: 11/072,465

(22) Filed: Mar. 4, 2005

(51) Int. Cl.
*G06F 1/12* (2006.01)
(52) U.S. Cl. .................. 713/401; 713/400; 713/503
(58) Field of Classification Search ............ 713/400, 713/401, 503; 714/700, 798, 799, 815; 716/4–6
See application file for complete search history.

(56) References Cited

U.S. PATENT DOCUMENTS

| | | | | |
|---|---|---|---|---|
| 5,258,660 A * | 11/1993 | Nelson et al. | .............. | 327/141 |
| 5,373,535 A * | 12/1994 | Ellis et al. | .............. | 375/354 |
| 5,692,165 A * | 11/1997 | Jeddeloh et al. | .............. | 713/400 |
| 5,819,076 A * | 10/1998 | Jeddeloh et al. | .............. | 713/401 |
| 5,821,773 A * | 10/1998 | Norman et al. | .............. | 326/39 |
| 5,852,640 A * | 12/1998 | Kliza et al. | .............. | 375/356 |
| 5,857,095 A * | 1/1999 | Jeddeloh et al. | .............. | 713/401 |
| 6,072,347 A * | 6/2000 | Sim | .............. | 327/276 |
| 6,184,707 B1 * | 2/2001 | Norman et al. | .............. | 326/39 |
| 6,219,384 B1 * | 4/2001 | Kliza et al. | .............. | 375/258 |
| 6,327,678 B1 * | 12/2001 | Nagai | .............. | 714/700 |
| 6,340,905 B1 * | 1/2002 | Schultz | .............. | 327/161 |
| 6,429,714 B1 * | 8/2002 | Schultz | .............. | 327/291 |
| 6,556,022 B2 * | 4/2003 | To et al. | .............. | 324/600 |
| 6,651,230 B2 * | 11/2003 | Cohn et al. | .............. | 716/6 |
| 6,812,760 B1 * | 11/2004 | Kim et al. | .............. | 327/158 |
| 6,820,234 B2 * | 11/2004 | Deas et al. | .............. | 714/814 |
| 6,889,336 B2 * | 5/2005 | Schoenfeld et al. | .............. | 713/503 |
| 6,903,582 B2 * | 6/2005 | Gaskins et al. | .............. | 327/141 |
| 6,952,789 B1 * | 10/2005 | Azim et al. | .............. | 713/400 |
| 7,058,911 B2 * | 6/2006 | Singh | .............. | 716/6 |
| 7,116,744 B2 * | 10/2006 | Saze et al. | .............. | 375/371 |
| 7,124,314 B2 * | 10/2006 | Hariharan et al. | .............. | 713/500 |
| 7,131,093 B1 * | 10/2006 | Aden | .............. | 716/6 |
| 7,185,239 B2 * | 2/2007 | Tiwari | .............. | 714/700 |
| 7,205,803 B2 * | 4/2007 | Chung et al. | .............. | 327/158 |
| 7,233,599 B2 * | 6/2007 | Deas et al. | .............. | 370/420 |
| 2003/0198309 A1 * | 10/2003 | Abrosimov et al. | .............. | 375/354 |
| 2005/0034006 A1 * | 2/2005 | Schoenfeld et al. | .............. | 713/401 |

\* cited by examiner

*Primary Examiner*—Nitin C Patel
(74) *Attorney, Agent, or Firm*—James E. Goepel; Robert P. Marley; Woodcock Washburn LLP

(57) ABSTRACT

Variable compensation for part to part skew of components in a substrate-mounted circuit is described. The variability may be provided through a computer software program acting on a programmable delay buffer such that compensation for a skewed signal may be continuously checked against a reference signal or through other methods. The skewed signal may be delayed until the signal matches, within a predetermined margin of error, the reference.

14 Claims, 5 Drawing Sheets

SYSTEMS AND METHODS FOR OVERCOMING PART TO PART SKEW IN A SUBSTRATE-MOUNTED CIRCUIT

FIELD OF THE INVENTION

The field of the invention generally relates to integrated circuits and specifically to compensating for signal skew caused by electronic components in integrated circuits.

BACKGROUND OF THE INVENTION

An integrated circuit developer may mount electronic components on a substrate (e.g., a printed circuit board, printed wiring board, etc.) in a predetermined sequence such that the components, in combination, perform a particular function on or alter signals that are transmitted between the components. For example, the components may be used for synchronization of an asynchronous input signal with a system's clock. Of course, such synchronization may take the form of state elements implemented inside of a component (e.g., a chip), but such board-mounted synchronization may be used when the component does not include appropriate state elements.

In using substrate-mounted components to perform functions on or alter signals, problems associated with part to part skew in the circuit may be encountered. For example, if the purpose of a substrate-mounted circuit is to synchronize an asynchronous input signal with a system clock, taking into account setup and hold times and a period for synchronization associated with a particular component, a window for transitions on a signal may be on the order of one or two nanoseconds. Components used in the circuit to synchronize the input signal with a system clock, however, may inherently produce signal skew. In a worst case scenario, the maximum part to part signal skew of each component in such a circuit may be additive and may foreclose the reliable probability of meeting the window for transitions. Thus, such inherent signal skew of substrate-mounted components may prevent the reliable performance of functions on or alterations of signals in a circuit. Additionally, even if part to part skew is within tolerable ranges in a substrate-mounted circuit, incorporating the circuit into a product and associating skew of other components in the product with the substrate-mounted circuit may increase skew in the circuit and force the circuit to fail.

Therefore, there is a need for offsetting or minimizing part to part skew in circuits that include substrate-mounted components. Additionally, the offsetting of such skew should be operable when the circuit is incorporated into a product.

SUMMARY OF THE INVENTION

The invention includes systems and methods for providing variable compensation for part to part skew of components in a substrate-mounted circuit. Part to part skew may be the difference between two delay paths within two similar components operating at a similar voltage and temperature. The variability may be provided through a computer software program acting on a programmable delay buffer such that compensation for a skewed signal may be continuously checked against a reference signal or through other methods described herein. The skewed signal may be delayed until the signal matches, within a predetermined margin of error, the reference.

The variable skew compensation may be incorporated in a substrate-mounted synchronization circuit to offset part to part skew in the circuit. A system clock may be inputted into a programmable delay buffer and be acted on by a computer executing a software program. The computer may compare a delayed skewed signal to a reference signal. Alternatively, tune points may be tested by being executed in a device which requires synchronization of an input signal to the system clock. If the tune points pass the test and enable the device to read or write, then the tune points may be saved in a list of passing tune points. A cluster of such passing tune points thus can be searched for a midpoint. The midpoint may be used to appropriately delay a skewed signal, thus compensating for the skew.

DETAILED DESCRIPTION OF ILLUSTRATIVE EMBODIMENTS

Figure 1:
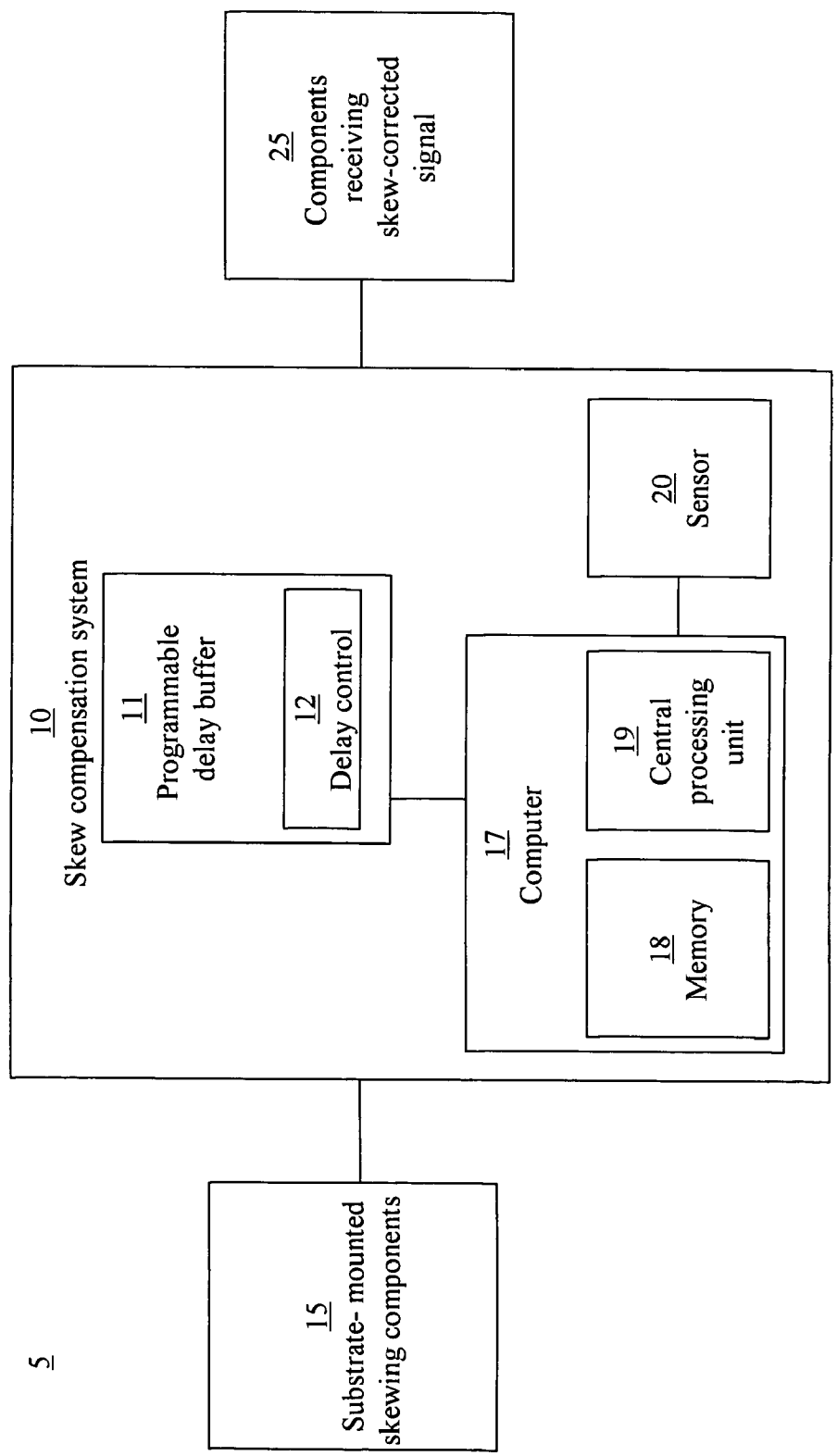
FIG. 1 is a block diagram of an example system for providing variable compensation for part to part skew in a substrate-mounted circuit according to the invention.

FIG. 1 is a block diagram of an example system 5 for providing variable compensation for part to part skew in a substrate-mounted circuit according to the invention. The system 5 may include substrate-mounted skewing components 15 that receive and, primarily because of the characteristics of the components, skew signals. The system 5 may also include a skew compensation system 10 for receiving the skew signals from the skewing components 15 and compensating or correcting the skewed signals to within a predefined tolerance. Finally, the system 5 may include components 25 that receive the corrected signals from the skew compensation system 10.

The skew compensation system 10 may include a programmable delay buffer 11, a delay control 12, a computer 17, and a sensor 20. The programmable delay buffer 11 may provide, in conjunction with the computer 17, programmatic, variable delay that compensates for skew caused by the substrate-mounted skewing components 15. The programmable delay buffer 11 may include the delay control 12 that provides an interfacing capability, enabling the programmable delay buffer 11 and other hardware to communicate with the computer 17.

The computer 17 may be any device that executes software programs. The computer 17 may include a memory 18 and a central processing unit 19. A software program may be executed by the computer 17, and the computer 17 may act on the programmable delay buffer 11 through the delay control 12 to delay a skewed signal received from the substrate-mounted skewing components 15. Through communication with the sensor 20, the computer 17 may compare the delayed skewed signal with a reference signal or reference point or points. The sensor 20 may thus facilitate the checking of the skewed signal against a predetermined reference and the delaying of the skewed signal until it matches (within a predetermined, acceptable error margin) the reference. When the skewed signal has been delayed and matches the reference signal, point, or points, the computer 17 may signal to the programmable delay buffer 11 that the signal may be sent. The programmable delay buffer 11 may then instigate the sending of the delayed signal to the components 25 receiving the skew-corrected signal.

Figure 2:
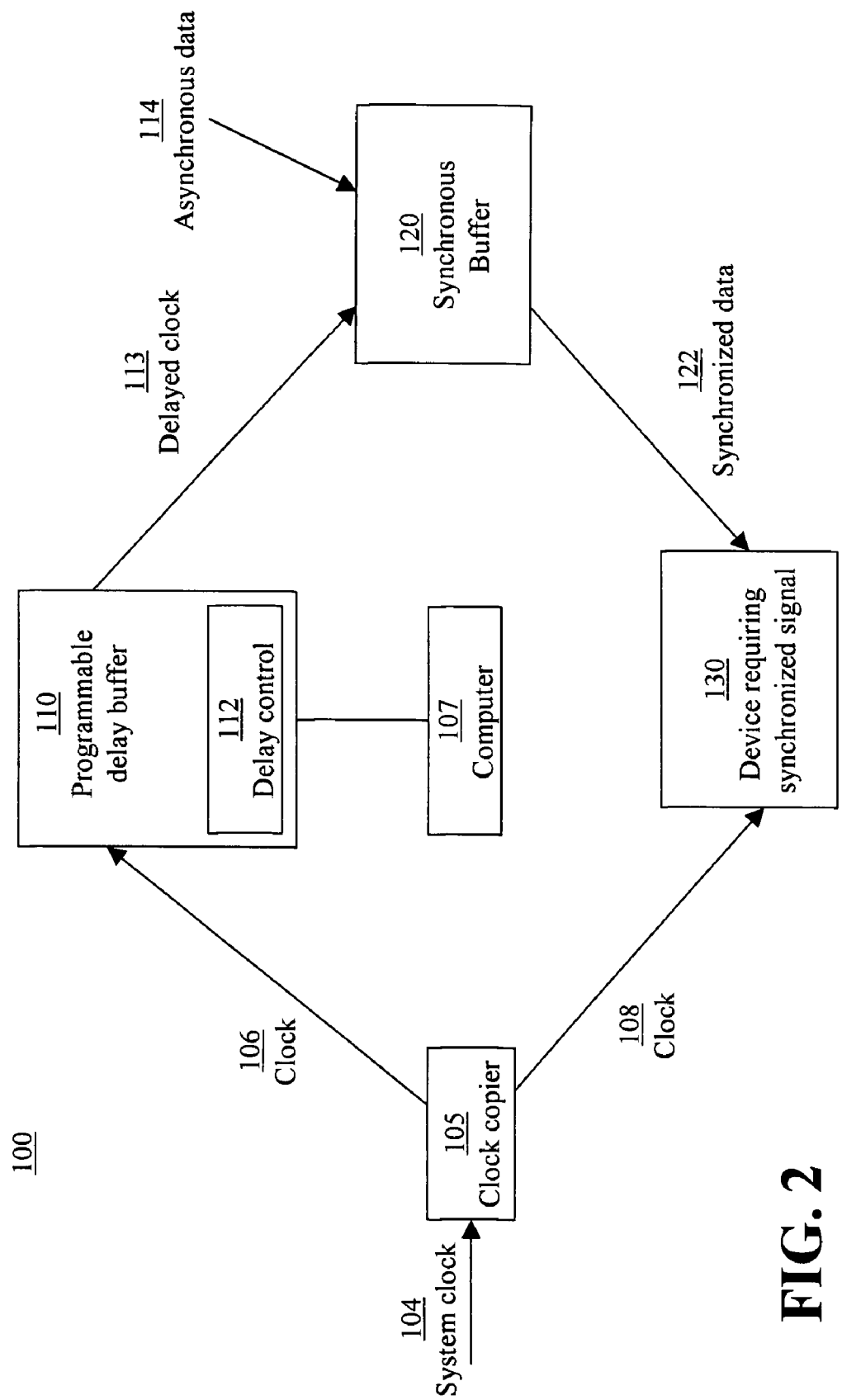
FIG. 2 is a block diagram of an example system for providing variable compensation for part to part skew in a substrate mounted circuit configured to synchronize a signal with a system clock according to the invention.

FIG. 2 is a block diagram of an example system 100 for providing variable compensation for part to part skew in a substrate mounted circuit configured to synchronize a signal with a system clock according to the invention. The system may be mounted on a substrate and include a system clock copier 105, a programmable delay buffer 110 and a synchronous buffer 120. A clock signal 104 may enter the system 100 and may be copied by the system clock copier 105, which may be any device for copying signals. A first copy of the signal, a clock signal 108, may be sent to a device 130. The device 130 may be a device requiring an input signal to be synchronized with a system clock.

A second copy of the clock signal, a clock signal 106, may be sent to the programmable delay buffer 110. The programmable delay buffer 110 may provide programmatic, variable delay that compensates for skew associated with components mounted on the substrate in the system 100. The programmable delay buffer 110 may include a delay control 112 that may provide an interfacing capability with a computer 107. The computer 107 may be any device that executes software programs, and may include, as described with regard to the computer 17 of FIG. 1, a memory and a central processing unit.

A software program may be executed on the computer 107 and alter, that is, delay the clock signal 106 such that a signal outputted from the programmable delay buffer 110 is a delayed clock signal 113. Through communication with the device 130 requiring an input signal to be synchronized to the system clock signal 104, the computer 107 may compare the delayed clock signal 113 with a reference signal in the device 130. The device 130 may thus facilitate the checking of the delayed clock signal 113 against the clock 108. The computer 107 may facilitate, in conjunction with the programmable delay buffer 110, delaying the delayed clock signal 113 until it matches (within a predetermined, acceptable error margin) the reference signal generated by the device 130. In alternative embodiments, the computer 107 may communicate with the device 130 or with the synchronous buffer 120 to determine whether the skew compensation correctly modifies the input signal. The programmable delay buffer 110 may divide the delayed clock signal 113 if required by components in the system 100. For example, if the clock signal 106 is 200 megahertz, the programmable delay buffer 110 may divide the clock signal 106 down such that the delayed clock signal 113 is 100 megahertz.

The synchronous buffer 120 may be a programmable logic device such as a complex programmable logic device (CPLD) and may provide synchronization of an asynchronous input signal 114 to the delayed clock signal 113. The output of the synchronous buffer 120 may be synchronous data 122 and may be sent to the device 130 requiring synchronization of the asynchronous input signal with the system clock 104.

Figure 3:
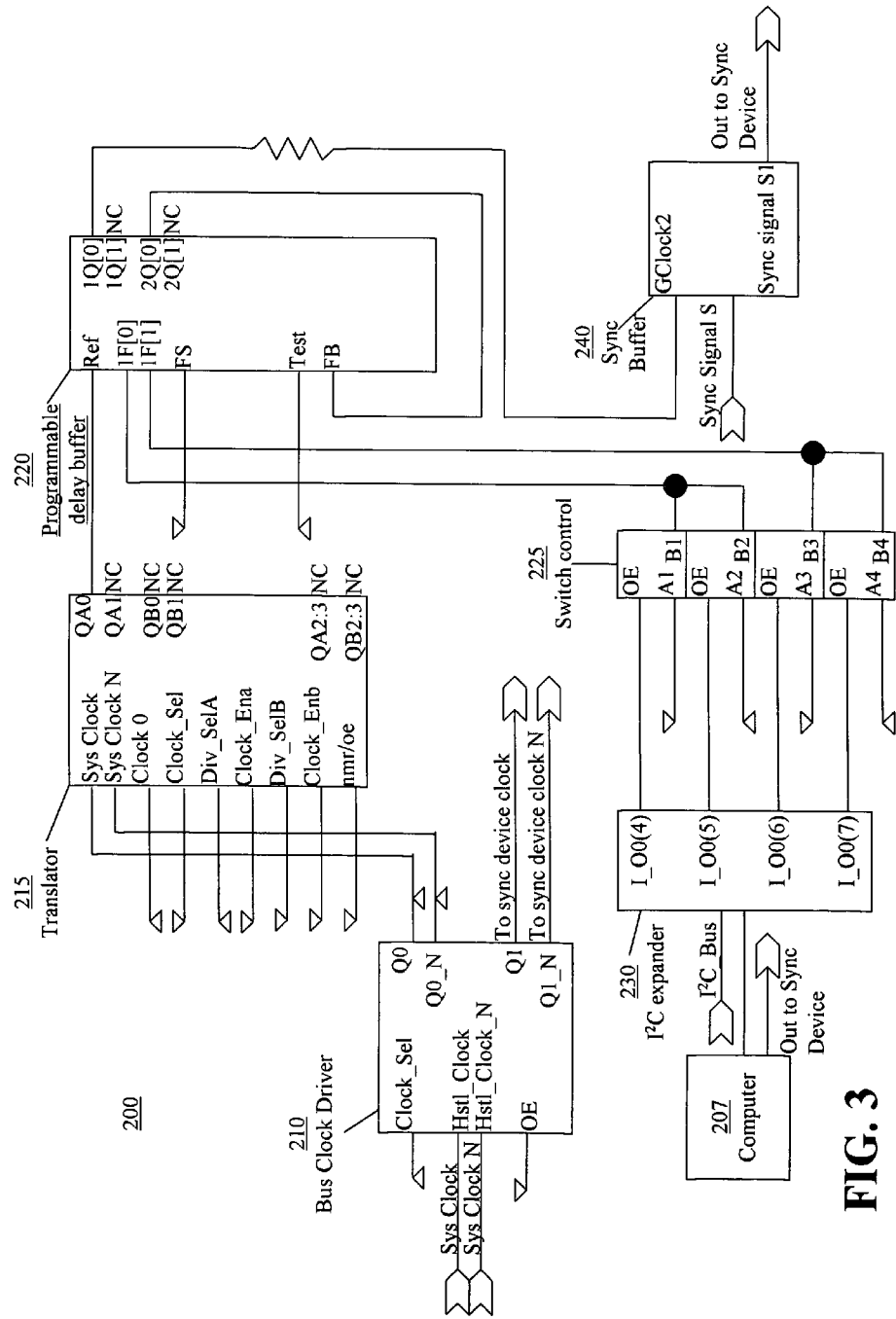
FIG. 3 is a block diagram of an alternative example system for providing variable compensation for part to part skew in a substrate mounted circuit configured to synchronize a signal with a system clock according to the invention.

FIG. 3 is a block diagram of an alternative example system for providing variable compensation for part to part skew in a substrate mounted circuit configured to synchronize a signal with a system clock according to the invention. The system 200 may include a bus clock driver 210, a translator 215, a programmable delay buffer 220, an I²C expander 230, a switch control 225, a synchronous buffer 240, and a computer 207. Those skilled in the art will recognize that embodiments of the invention are not limited to the devices or configuration of the example system 200 and that the system 200 is described herein for purposes of illustration and not limitation.

System clocks Sys Clock and Sys Clock N may enter the system 200 at the bus clock driver 210. The bus clock driver 210 may copy the system clock and fan the clock to multiple destinations. Additionally, the system clock, for example, may be inputted in the bus clock driver 210 in HSTL format and may be outputted from the bus clock driver 210 in HSTL format. One set of outputs Q1, Q1_N of the bus clock driver 210 may be used to drive system clock inputs in the device (not shown) requiring synchronization of an input signal with the system clock. Another set of outputs Q0, Q0_N may provide system clock inputs Sys Clock, Sys Clock N to a translator 215. The bus clock driver 210 may be, for example, a SY89809 bus clock driver manufactured by Micrel Semiconductor, Inc., San Jose, Calif.

The translator 215 may, for example, convert the HSTL formatted clock signals Sys Clock, Sys Clock N to a single-ended TTL version of the signal. Use of any such translator may depend on the requirements of other components in the system 200. Depending on the requirements of the other components in the system 200, the translator may also divide the inputted system clock and output a divided clock signal QA0. The translator, for example, may be an ICS870081 clock generator manufactured by Integrated Circuit Systems, Inc., Norristown, Pa.

The divided clock signal QA0 outputted from the translator 215 may be inputted as a reference signal Ref at the programmable delay buffer 220. The programmable delay buffer 220 may take the divided, single ended clock signal reference Ref as a reference clock input. A first output signal 1Q[0] of the programmable delay buffer 220 may be a skewed version of the clock signal Sys Clock that is used by the synchronous buffer 240. A second output signal 2Q[0] of the programmable delay buffer 220 may be routed to a feedback clock input FB of the programmable delay buffer 220. The programmable delay buffer 220 may include tri-level input signals 1F[0], 1F[1] that may control skew of the output clock signal 1Q[0] relative to the incoming signal reference Ref The tri-level inputs 1F[0], 1F[1] may enable two inputs to provide nine potential stepping points. If, for example, the clock period is 5 ns, then the number of steps may provide a granularity per step of 625 ps. The programmable delay buffer 220 may be a CY7B9911V-5 multi-phase, phase lock loop clock buffer manufactured by Cypress Semiconductor Corporation, San Jose, Calif.

The tri-level signals F[0], F[1] of the programmable delay buffer 220 may be controlled by a switch control 225 that opens and closes paths between the I²C expander 230 and the programmable delay buffer 220. For example, two signals B1, B3 may be tied high, while two other input signals B2, B4 may be tied low. By selecting one path to be open or both to be off, the tri-level signals F[0], F[1] signals may be pulled in a desired direction or left to float to a mid-level specified by the I²C expander 230. The switch control 225 may be an SN74CBTLV3125 switch manufactured by Texas Instruments, Inc., Houston, Tex.

Output signals of the I²C expander 230 may compensate for skew in the system 200. The compensation may be facilitated by software executed on the computer 107. For example, the software may provide for the determination of time periods during which a bus within the device (not shown) requiring synchronization of an input signal to a system clock is and is not operational. The software may cycle through possible tune values and test whether the I²C interface can read and write to the device 130 requiring a synchronized input signal. When a tune value proves to be working, it may be added to a list of passing values. The list then may be searched for the largest cluster of passing values. The program may choose a center value in the cluster to be the best tune value to base a delay in the skewed signal. In this way, through execution of the software, a range of tune points that are operational may be created. A point within the range may be selected to provide synchronization. For example, a middle point of the range may be determined for each stage and applied to provide proper delay for the output delayed clock signal 1Q[0] from the programmable delay buffer 210.

The I²C expander 230 may be a PCA9555 expander manufactured by Koninklijke Philips Electronics N.V., Netherlands. The below table shows an example mapping of outputs of the PCA9555 I²C expander 230 to the programmed skew relative to a system clock:

| I²C Board Expander Bits | | | | |
|---|---|---|---|---|
| 4 | 5 | 6 | 7 | Relative Skew |
| 1 | 1 | 1 | 1 | 0 ps |
| 0 | 1 | 1 | 1 | +625 ps |
| 1 | 0 | 0 | 1 | +1250 ps |
| 1 | 1 | 0 | 1 | +1875 ps |
| 0 | 1 | 0 | 1 | +2500 ps |
| 1 | 0 | 1 | 1 | −625 ps |
| 0 | 1 | 1 | 0 | −1250 ps |
| 1 | 1 | 1 | 0 | −1875 ps |
| 1 | 0 | 1 | 0 | −2500 ps |

A synchronization buffer 240 may provide synchronization of an asynchronous input signal to the delayed clock signal 1Q[0] from the programmable delay buffer 220. The synchronization buffer 240 may include dual-ranked registers to synchronize an asynchronous signal S to a system clock Gclock2. A synchronized signal output of the synchronization buffer 240 may be sent to the device (not shown) requiring an input signal synchronized with a system clock. The synchronized buffer may be an EMP7064AETC100-7 CPLD manufactured by Altera, Inc., San Jose, Calif.

Figure 4:
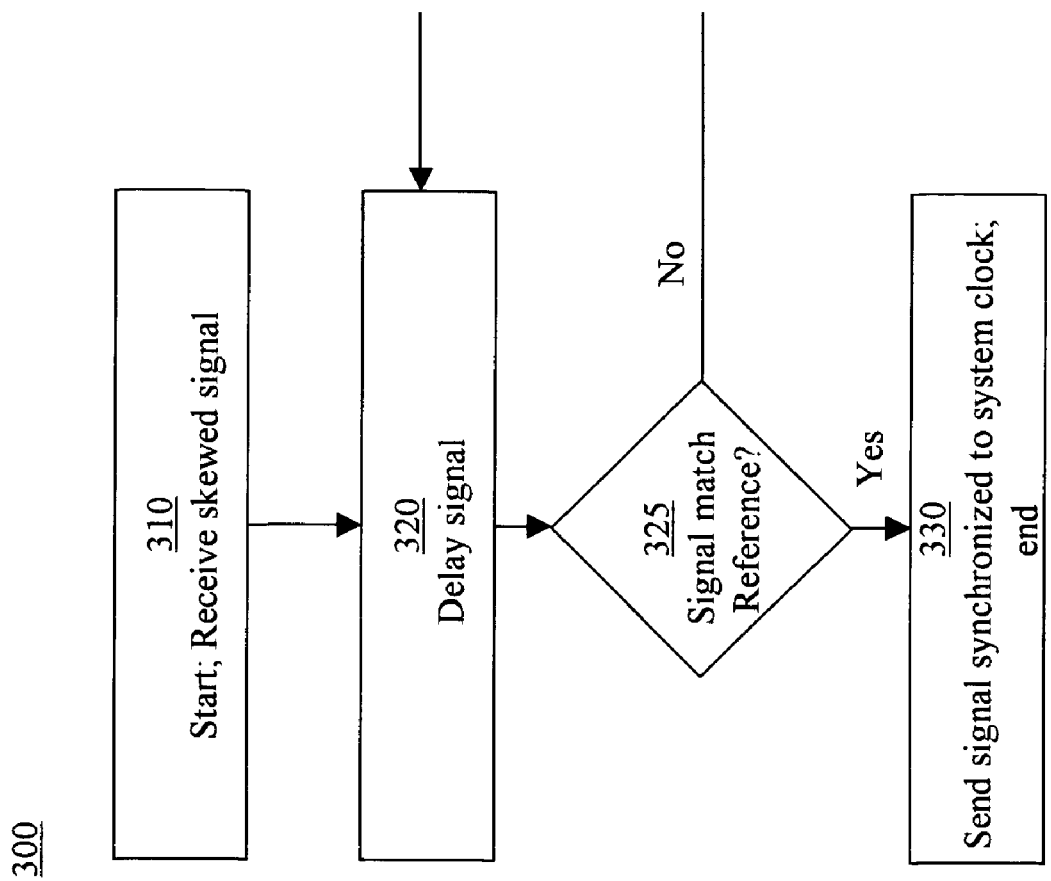
FIG. 4 is a flow diagram of an example method for providing variable compensation for part to part skew in a substrate mounted circuit according to the invention.

FIG. 4 is a flow diagram of an example method 300 for providing variable compensation for part to part skew in a substrate mounted circuit according to the invention. At step 310, a device such as a programmable delay buffer or a skew compensation system may receive a skewed signal from a substrate-mounted component. At step 320, the skewed signal may be delayed. A comparison may be made between the delayed skewed signal and a reference signal and, at step 325, if the comparison indicates that the delayed skewed signal is not within a predefined margin and thus does not match the reference signal, the delayed skewed signal may be delayed more. If at step 325, a comparison of the delayed skewed signal and a reference signal indicates that the delay has compensated for the skew (again, within a predefined tolerance), then at step 330, the signal may be sent to an appropriate destination.

Figure 5:
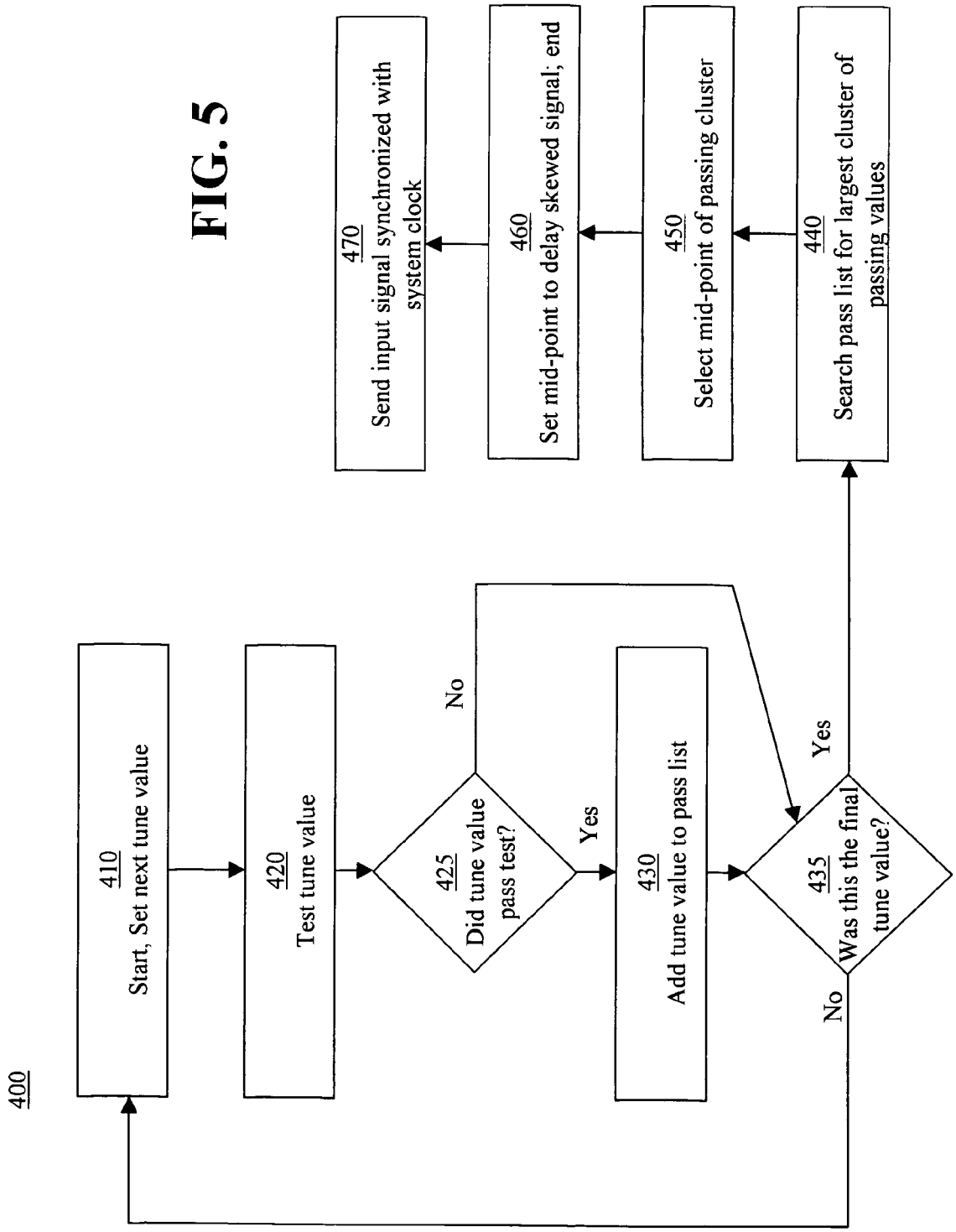
FIG. 5 is a flow diagram of an example method for determining an appropriate delay to be applied to signals to compensate for skew in the signals according to the invention.

FIG. 5 is a flow diagram of an example method for determining an appropriate delay to be applied to signals to compensate for skew in the signals according to the invention. At step 410, a tune value in a signal may be set and, at step 420, the tune value may be tested. As described herein, such a test may determine, for example, whether an I²C expander interface can read and write to a device requiring a synchronized input signal. If at step 425 the tune value passes the test, then the tune value may be added to a list at step 430. If the tune value does not pass the test, then it is not added to the list. If at step 435, more tune values are to be evaluated, then the method from step 410 may be repeated. If no more tune values are to be evaluated, then at step 440, the list may be searched for a cluster of passing values. A mid point of such a cluster may be determined at step 450, and the mid-point may be used in delaying a skewed signal to compensate for the skew at step 460. At step 470, the input signal synchronized with the system clock may be sent to an appropriate destination.

The programming necessary to effectuate the processes performed in connection with the present invention may be relatively straight-forward and should be apparent to the relevant programming public. Any particular programming language or methods may be employed to effectuate the present invention without departing from the spirit and scope thereof.

In the foregoing description, it can be seen that the present invention comprises a new and useful mechanism for compensating for signal skew caused by components in a substrate-mounted system. It should be appreciated that changes could be made to the embodiments described above without departing from the inventive concepts thereof. It should be understood, therefore, that this invention is not limited to the particular embodiments disclosed, but it is intended to cover modifications within the spirit and scope of the present invention as defined by the appended claims.

What is claimed:

1. A system for compensating for signal skew in a substrate mounted circuit, comprising:
    a programmable delay buffer; and
    a computer in communication with the programmable delay buffer, the programmable delay buffer receiving a component signal from a first component, the component signal having skew;
        wherein the programmable delay buffer applies a first delay to the component signal resulting in a first delayed signal;
        wherein the computer determines if the first delay compensates for the skew in the component signal by comparing the first delayed signal with a reference signal after the component signal is first received by the system;
        wherein after the computer determines if the first delay compensates for the skew, the programmable delay buffer applies a second delay to the first delayed signal, resulting in a second delayed signal;
        wherein after the programmable delay buffer applies the second delay, the computer indicates to the programmable delay buffer that the second delay compensates for the skew in the signal;
        wherein the computer saves the first delay and the second delay to a pass list;
        wherein the computer determines from the pass list at least two delay values that compensated for the skew in the signal;
        wherein the computer determines a mid-point of the at least two delay values; and,
        wherein the computer uses the mid-point to delay the signal;
    wherein the programmable delay buffer is programmed prior to the use of the substrate mounted circuit.

2. The system of claim 1, further comprising: a sensor comprising the reference signal, wherein the sensor communicates the reference signal to the computer.

3. The system of claim 1, further comprising: a synchronous buffer connected to the programmable delay buffer for synchronizing the second delayed signal with a second signal resulting in a synchronized signal and sending the synchronized signal to a second component.

4. The system of claim 3, wherein the computer determines if the applied first delay compensates for the skew by determining a time period during which a bus associated with the second component is operational.

5. The system of claim 4, wherein determining a time period during which the bus is operational comprises prompting the second component to perform a read or write operation.

6. The system of claim 4, further comprising: a switch control for controlling signal paths to the programmable delay buffer.

7. The system of claim 1, wherein the first component is a signal copier for copying the component signal.

8. The system of claim 7, wherein the signal copier sends a copy of the component signal to the second component.

9. A method for compensating for signal skew in a substrate-mounted circuit, comprising:
   receiving an initial signal from a first component, wherein the signal comprises skew produced by the first component;
   delaying the initial signal resulting in a first delayed signal;
   comparing the first delayed signal to a reference signal after the initial signal is received;
   delaying the first delayed signal resulting in a second delayed signal;
   comparing the second delayed signal to the reference signal;
   sending the second delayed signal to a second component;
   determining that delaying the first delayed signal compensated for the skew, the determining comprising:
      setting a tune value in the second delayed signal;
      testing the tune value at the bus;
      saving the tune value to a pass list if the tune value passes the test, wherein the tune value passes the test if the bus is operational;
      determining from the pass list a cluster of tune values that passed the test;
      determining a mid-point of the cluster; and,
      using the mid-point to delay the signal
   wherein determining that delaying the first signal compensated for the skew comprises determining a time period during which a bus associated with the second component is operational.

10. The method of claim 9, wherein the reference signal is a system clock.

11. The method of claim 9, further comprising:
   synchronizing an input signal with the second delayed signal resulting in a synchronized input signal; and
   sending the synchronized input signal to the second component.

12. A computer-readable medium having computer-executable instructions stored thereon for performing steps, comprising
   receiving an initial signal from a first component, wherein the initial signal comprises skew produced by the first component;
   delaying the initial signal resulting in a first delayed signal;
   comparing the first delayed signal to a reference signal after the initial signal is received;
   delaying the first delayed signal resulting in a second delayed signal;
   comparing the second delayed signal to the reference signal; and
   sending the second delayed signal to a second component;
   determining that delaying the first delayed signal compensated for the skew;
   sending the second delayed signal to a second component;
   determining a time period during which a bus associated with the second component is operational;
   setting a tune value in the second delayed signal;
   testing the tune value at the bus;
   saving the tune value to a pass list if the tune value passes the test, wherein the tune value passes the test if the bus is operational;
   synchronizing an input signal with the second delayed signal resulting in a synchronized input signal; and
   sending the synchronized input signal to the second component.

13. The computer-executable instructions of claim 12 wherein the reference signal is a system clock.

14. The computer-executable instructions of claim 12 further comprising:
   synchronizing an input signal with the second delayed signal resulting in a synchronized input signal; and
   sending the synchronized input signal to the second component.

* * * * *